United States Patent

Tominaga et al.

[15] 3,688,165

[45] Aug. 29, 1972

[54] FIELD EFFECT SEMICONDUCTOR DEVICES

[72] Inventors: Yoshio Tominaga; Hiroto Kawagoe; Yuichi Teranishi, all of Tokyo, Japan

[73] Assignee: Hitachi, Ltd., Tokyo, Japan

[22] Filed: Aug. 26, 1970

[21] Appl. No.: 67,141

[30] Foreign Application Priority Data

Aug. 27, 1969 Japan ......................44/67192

[52] U.S. Cl....317/235 R, 317/235 AJ, 317/235 AK, 317/235 B, 317/235 G

[51] Int. Cl. ............................................H01l 11/14

[58] Field of Search ......317/235 AJ, 235 AK, 235 B, 317/235 G, 235 H, 235 Z, 235 E, 235 AG, 235 AE

[56] References Cited

UNITED STATES PATENTS

| | | | |
|---|---|---|---|
| 3,426,255 | 2/1969 | Heywang | 317/235 |
| 3,573,509 | 4/1971 | Crawford | 307/303 |
| 3,113,220 | 12/1963 | Goulding | 307/88.5 |
| 3,570,112 | 3/1971 | Barry et al. | 29/571 |
| 3,513,364 | 5/1970 | Heiman | 317/235 |

*Primary Examiner*—Martin H. Edlow
*Attorney*—Craig & Antonelli

[57] ABSTRACT

A semiconductor device in which, for example, an insulated gate type field effect transistor is formed in a major surface of an N-type silicon substrate having an edge that is formed by mechanical separation; a P-type region is formed in a portion of the edge area of the substrate or in the entire edge area of the substrate, and a metal electrode for grounding is connected to the P-type region.

16 Claims, 6 Drawing Figures

INVENTORS
YOSHIO TOMINAGA, HIROTO KAWAGOE AND
BY YUICHI TERANISHI

Craig, Antonelli, Stewart & Hill
ATTORNEYS

INVENTORS
YOSHIO TOMINAGA, HIROTO KAWAGOE
BY AND YUICHI TERANISHI
Craig, Antonelli, Stewart & Hill
ATTORNEYS

FIELD EFFECT SEMICONDUCTOR DEVICES

This invention relates to a field effect semiconductor device, and more particularly to a ground or substrate electrode structure thereof.

In a field effect semiconductor device, for example, in an insulated gate type field effect transistor, a second gate electrode is formed on the substrate in addition to a gate electrode, and the second electrode has to be kept at a certain constant potential, for example, it has to be grounded to prevent the operation of the device from becoming unstable due to a change of the potential of the second gate electrode. In an integrated circuit device, in which a plurality of insulated gate type field effect semiconductor elements are formed in a common semiconductor substrate, it is especially necessary to fix the potential of the substrate at a certain constant value in order to minimize the influences among the circuit elements. The most general method for grounding is usually done by providing a suitable solder or a eutectic alloy with the semiconductor material on the bottom of the semiconductor substrate and by connecting the ground electrode thereto. However, the aforementioned soldering or alloying requires a metallizing or plating process or a tab connecting process, etc., to be performed at the bottom of the substrate or on a package etc., so that the manufacturing process is rendered complicated thereby. In some kind of packaging structures, it is, however, desired to simplify the manufacturing process by directly molding or fixing the semiconductor substrate without any soldering or alloying treatment.

In the case of grounding without connecting the ground electrode to the bottom of the semiconductor substrate as described above, the ground electrode is usually formed on a major surface of the substrate, in which circuit elements are also formed, and since generally a plurality of necessary electrodes are formed at the same time, they are caused to have a common structure regardless of the conductivity type of the semiconductor.

For example, when silicon is used as the semiconductor material, aluminum is generally used for the electrodes. In this case, all electrodes having the common structure cannot easily form non-rectifying contacts with both of the semiconductor regions having different conductivity types. For example, aluminum acts for silicon as a P-type impurity and forms a PN junction with N-type silicon. Generally, in an insulated gate type field effect semiconductor device, the resistivity of the semiconductor substrate is determined by the electrical characteristics thereof and it is difficult to have a substrate of low resistivity. Hence, in case of an aluminum electrode on an N-type silicon of high resistivity, a PN junction may be formed between the semiconductor substrate and the electrode connected thereto. In the PN junction, as is clear from the voltage-current characteristics thereof, when an applied voltage of a forward direction is lower than a rising voltage Vth thereof, an electric current hardly flows, and in the case of an applied voltage of a backward direction, the electric current hardly flows until the applied voltage reaches the breakdown voltage $V_B$ of the PN junction. In a semiconductor device having such a ground electrode structure on the surface of the substrate, when the supply voltage and the signal voltage, etc., are applied to one electrode of the device, for example, to a drain electrode, an electric current flows in the path between the drain electrode and the ground electrode by a charge-and-discharge current and a leakage current, etc., of the PN junction between the drain and the substrate, which constitutes a capacitor, whereby the voltage between the ground electrode and the substrate is caused to be changed. The change of the voltage is caused by the aforementioned current. In other words, the electric current which flows between the ground electrode and the semiconductor substrate is usually in the range of a bias current so as to apply to the PN junction a voltage lower than the rising voltage Vth. This is equivalent to interposing a very large impedance between the ground electrode and the semiconductor substrate. As a result thereof, the potential difference caused between the ground electrode and the semiconductor substrate is changed greatly by the aforementioned electric current which appears in the ground electrode and is undesirable for the stabilization of the circuit. Especially, in an integrated circuit device in which a plurality of insulated gate type field effect semiconductor elements are formed in a common semiconductor substrate, the bad influences on the circuit operation by the aforementioned current is not insignificant and cannot be ignored since a large amount of feed back signal is applied to the semiconductor elements.

In a ground electrode structure, as a means for stabilizing the potential of the substrate, a high-concentration diffused layer having the same conductivity type as the substrate may be formed in the substrate, and the ground electrode may be formed thereon, so that a PN junction having the undesirable current-voltage characteristic is essentially not formed, the aforementioned rising phenomenon of the current-voltage characteristic does not appear, and the effectiveness of the grounding may be increased. While in the insulated gate type field effect semiconductor device the drain and the source regions are formed by diffusing an impurity of a conductivity type different from that of the semiconductor substrate, it would, however, be necessary in that case further to form by diffusion a region having the same conductivity type as the substrate, thereby entailing the disadvantages that the number of manufacturing steps is increased, that especially in the step of using photo-resist as a mask for the selective diffusion, pinholes are formed in an insulating film, that the impurity is diffused in undesired portions through the pinholes, that especially a thin insulating film under a gate is rendered defective thereby, and that the characteristics and yield are greatly deteriorated.

Accordingly, it is an object of this invention to provide a field effect semiconductor device having a novel improved structure of a ground electrode in which no tab or soldering is needed, thereby eliminating the aforementioned defects and shortcomings.

It is another object of this invention to provide a field effect semiconductor device in which by taking advantage of the fact that a leakage current in a distorted layer formed in a section of the semiconductor substrate by a scribing process is high, the ground electrode is provided at the distorted layer.

It is another object of this invention to provide a semiconductor device fixed on an insulating support member without requiring any metallizing process at the bottom of the semiconductor substrate.

These and further objects, features and advantages of the present invention will become more obvious from the following description when taken in connection with the accompanying drawing which shows, for purposes of illustration only, several embodiments in accordance with the present invention, and wherein.

Figure 1:
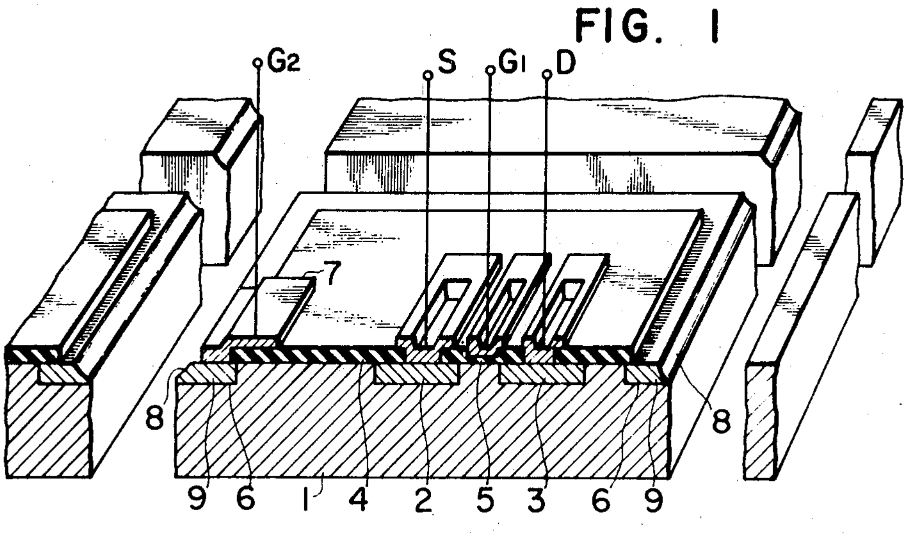
FIG. 1 is a partial perspective view, partly in cross-section, showing the principal structure of one embodiment of an insulated gate type field effect semiconductor device according to this invention.

Referring now to the drawing, wherein like reference numerals are used throughout the various views to designate like parts, and more particularly to FIG. 1, this figure shows the typical structure of an insulated gate type field effect transistor, a so-called MOS field effect transistor according to this invention, in which an oxide film is used as an insulating film. In FIG. 1, reference numeral 1 designates an N-type silicon semiconductor substrate having a high resistivity of about 1 to 10Ωcm, reference numerals 2 and 3 designate respectively a source and a drain region of P-type having a low resistivity of about 0.01 to 0.1Ωcm and a depth of about 2 to 5 μ formed in the major surface of the substrate by selectively diffusing a P-type impurity, for example, boron; a source electrode S and a drain electrode D of, for example, aluminum are formed on the regions 2 and 3, respectively, while silicon oxide films 4 and 5 are formed on the surface of the substrate as an insulating passivation film, and a gate electrode G1 is formed on the surface of the film 5. The source, drain, and gate regions constitute an MOS field effect transistor, and it will be understood that a plurality of such MOS transistors constitute an integrated circuit device. Reference numeral 6 designates a portion of a boundary for separating the semiconductor substrate 1 in which the semiconductor device or the integrated circuit device is formed, desirably the region 6 is a P-type diffused region having a low resistivity of about 0.01 to 0.1Ωcm and formed simultaneously with the source and drain regions 2 and 3, while reference numeral 8 designates a groove formed by mechanically scribing along the P-type diffused regions 6 so that the semiconductor substrate 1 is divided into several pieces. A ground electrode or substrate electrode G2 is connected at least to the P-type region 6 and also is adapted to be connected to the substrate 1, and extends over at least a part of the silicon oxide film 4 from the region 6.

Figure 2:
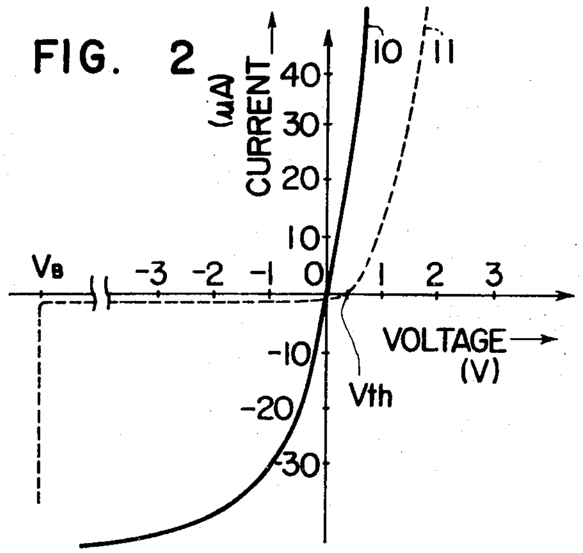
FIG. 2 is a diagram illustrating the electric characteristic curves of diodes to explain the difference between ground electrodes according to this invention and according to the prior art technique.
Figure 3:
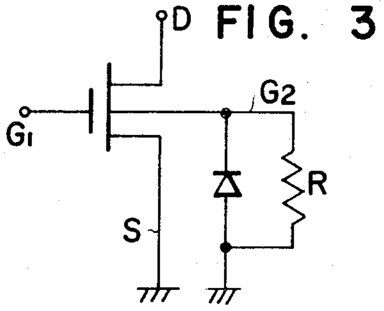
FIGS. 3 and 4 are equivalent circuit diagrams of semiconductor devices according to this invention and according to a conventional prior art technique, respectively.
Figure 4:
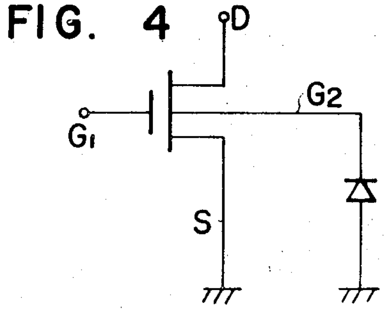

In the P-type diffused region 6 of the semiconductor device having the structure described above, a mechanical distortion layer 9 is formed in the region 6 and along the edge of the substrate 1 by the step of mechanically scribing the substrate and/or by the step of separating the substrate at the scribed portion. It is found that when a voltage is applied to the PN junction having the mechanical distortion layer 9 and exposed to the side wall of the substrate 1, a large amount of leakage current flows. Therefore, by using the P-type diffused region 6, to which the scribing treatment was applied, as a part of the ground electrode, the voltage-current characteristic of the PN junction without the aforementioned rising phenomenon can be obtained. In FIG. 2, the curve 10 in full lines illustrates the voltage-current characteristic curve in the current path between the substrate electrode G2 and the substrate 1 using the diffused region 6 to which the scribing treatment was applied for the ground electrode. FIG. 3 shows an equivalent circuit of the semiconductor device as shown in FIG. 1. The dotted curve 11 in FIG. 2 shows the voltage-current characteristic curve for the case, in which the ground electrode is formed directly on the substrate without the aforementioned distorted PN junction. FIG. 4 shows an equivalent circuit of the semiconductor device according to the conventional prior art technique. It can be seen from FIG. 2 that the leakage current between the diffused region, in which the scribing treatment was performed, and the semiconductor substrate is about 20 to 30 μA when a voltage of 0.3 to 0.4 volts is applied and this is equivalent to grounding the substrate 1 through a 10 to 21 KΩresistance R, as shown in FIG. 3.

In this invention it is desirable that the P-type distorted region 6 be so formed in the semiconductor substrate as to substantially completely surround the regions for the circuit elements, namely, the source and drain regions 2 and 3 as shown in FIG. 1. It is furthermore desirable that the metal electrode 7 for the substrate be formed substantially over the entire surface area of the P-type distorted region 6.

Figure 5:
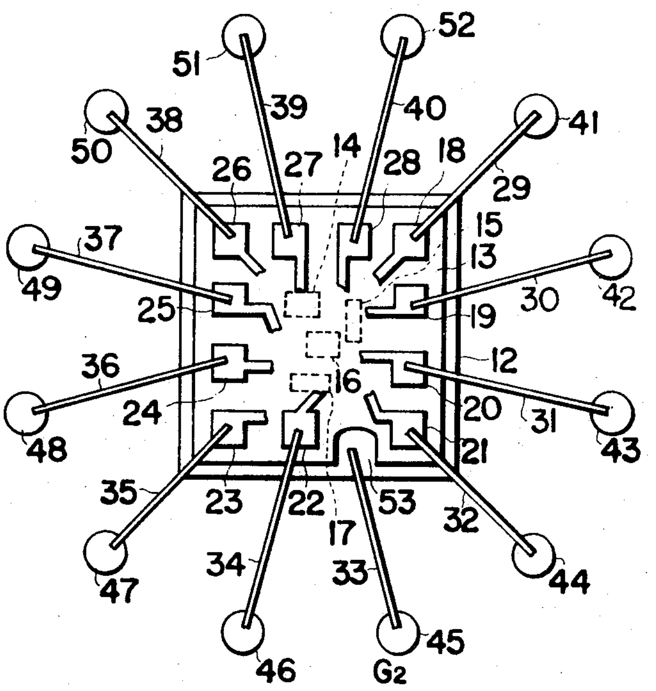
FIG. 5 is a somewhat schematic plan view of an insulated gate type field effect semiconductor integrated circuit device in which the present invention is used.

FIG. 5 shows a plan view of an MOS integrated circuit device according to another embodiment of this invention. Reference numeral 12 designates in this figure a silicon semiconductor substrate, reference numerals 13 through 17 designate MOS elements formed therein, reference numerals 18 to 28 designate internal electrode terminals connected to the electrodes of the elements, reference numeral 53 a ground electrode or substrate electrode, reference numerals 41 to 52 external terminals, and reference numerals 29 to 40 connector wires connecting a respective one of the internal terminals to the corresponding one of the external terminals.

As explained by reference to the described embodiments, the characteristic feature of this invention resides in the fact that in a semiconductor device in which an insulated gate type field effect semiconductor element is formed on the major surface of the substrate having an edge separated by a mechanical treatment, a region having an opposite conductivity type to that of the substrate is formed in a portion of the edge of the substrate or desirably in the entire edge area of the substrate and the ground electrode is connected thereto. Therefore, since the leakage current of the PN junction in the mechanically distorted layer formed in the portion of the edge of the semiconductor substrate, in which the insulated gate type field effect semiconductor element is formed, is large and the ground electrode is formed thereon, the effectiveness of the grounding can be increased according to this invention. Furthermore, the formation of the PN junction is done simultaneously with the selective diffusion step for forming the insulated gate type field effect semiconductor element, thereby entailing the advantages that an additional manufacturing step is not necessary and this PN junction can be formed very easily. Also, according to this invention, one obtains the advantage that the semiconductor substrate may be fixed directly to a support of, for example, a ceramic material of conventional type by a suitable adhesive, for example, glass.

Figure 6:
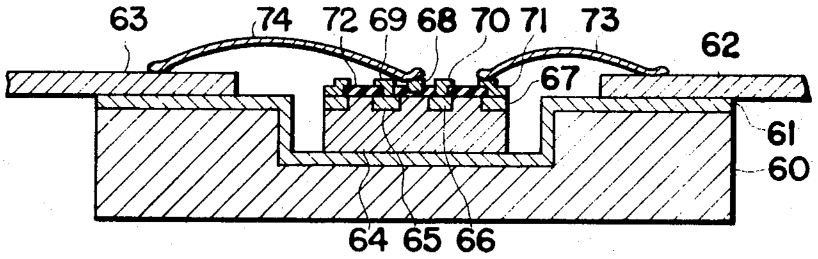
FIG. 6 is a cross-sectional view of a semiconductor device in which a semiconductor substrate according to this invention is mounted on an insulating support member.

In FIG. 6, an integrated circuit device according to this invention is fixed on an insulating support member, in which the semiconductor substrate 64 of N-type is directly fixed onto the bottom of a cavity formed in the insulating support member 60 of, for example, ceramic material by way of a glass layer 61 without requiring any metallizing process at the bottom of the semiconductor substrate. Reference numeral 65 and 66 designate the source and drain regions of P-type and reference numeral 67 the P-type region for a substrate electrode formed at the edge portion of the substrate 64. An insulating layer 72 of, for example, silicon oxide is conventionally formed on a major surface of the substrate 64. The gate, source, drain and substrate electrodes 68, 69, 70 and 71, respectively, are also formed on a major surface of the substrate 64. Lead-out leads 62 and 63 are fixed on the insulating support member 60 by way of the glass layer 61 and the lead-out leads 62 and 63 are electrically connected to the electrodes formed on the major substrate surface by way of connecting wires 73 and 74. In this figure, a plurality of other lead-out leads and connecting wires other than 62, 63, 73 and 74 which are present, are not shown for the sake of simplifing the explanation.

While the invention has been particularly described with reference to preferred embodiments of insulated gate type field effect semiconductor devices, it will be understood that the invention is not to be limited to the specific details thereof. For example, the electrode structure described in connection with these embodiments is applicable to the electrode structure for leading out semiconductor substrate terminals of a junction-type field effect semiconductor device. It is, therefore, obvious that the present invention is not limited to the details shown and described herein but is susceptible of numerous changes and modifications as known to persons skilled in the art, and we therefore do not wish to be limited to these details but intend to cover all such changes and modifications as are encompassed by the scope of the appended claims.

What we claim is:

1. A semiconductor device comprising:

a semiconductor substrate having a major surface and an edge;

an insulated gate type field effect semiconductor element formed in the major surface of the semiconductor substrate; a region of a conductivity type opposite to that of the substrate formed in at least a portion of the major surface at the edge of the substrate, said region exposed to a surface of said edge;

an electrode contacted with said region; and a surface layer with distortion formed on said surface of said edge by mechanical separation so as to to make said electrode act as an electrode for electrically grounding the substrate.

2. A semiconductor device comprising a semiconductor substrate of a first conductivity type having a major surface and a side wall;

a plurality of semiconductor regions of a semiconductor element having a second conductivity type opposite to said first conductivity type formed in the major surface of said substrate by selective diffusion;

a further semiconductor region of a second conductivity type formed at the edge portion of said substrate so as to surround at least partially said semiconductor regions and defining with said substrate a PN junction exposed to said side wall of said substrate;

a metal electrode formed on said major surface of said substrate and contacted with said further semiconductor region; and a surface layer with mechanical distortion formed on said side wall to make said electrode act as an electrode for electrically grounding said substrate.

3. A semiconductor device comprising: a semiconductor substrate of a first conductivity type having a major surface and an edge;

at least a semiconductor element formed in the major surface thereof;

a first electrode formed over the major surface for the semiconductor element; a further region of a second conductivity type provided at least over a portion of the edge of the substrate a second electrode for electrically grounding the substrate contacted with at least a part of said further region and positioned in substantially the major surface with the first electrode; and a surface layer with distortion formed on said portion of the edge by mechanical treatment so as to make a leakage current path between said further region and the substrate.

4. A semiconductor device according to claim 3, characterized in that said second electrode extends substantially over the entire further region.

5. A semiconductor device according to claim 4, characterized in that said further region extends substantially over the entire edge area of said substrate.

6. A semiconductor device according to claim 5, characterized in that said first conductivity type is an N conductivity type, said second conductivity is a P conductivity type, and said second electrode essentially consists of a metallic material prone to form a PN junction with said substrate.

7. A semiconductor device according to claim 6, characterized in that said semiconductor element is an insulated gate type field effect semiconductor element.

8. A semiconductor device according to claim 3, characterized in that said further region extends substantially over the entire edge area of said substrate.

9. A semiconductor device according to claim 3, characterized in that said further region substantially surrounds said first region.

10. A semiconductor device according to claim 3, characterized in that said first conductivity type is an N conductivity type, said second conductivity is a P conductivity type, and said stabilizing electrode essentially consists of a metallic material prone to form a PN junction with said substrate.

11. A semiconductor device according to claim 10, characterized in that said second electrode essentially consists of aluminum.

12. A semiconductor device according to claim 3, characterized in that said semiconductor element is an insulated gate type field effect semiconductor element.

13. A semiconductor device according to claim 2, characterized in that said further semiconductor region substantially surrounds the others of said semiconductor regions.

14. A semiconductor device comprising:

a semiconductor substrate of a first conductivity type having a major surface and an edge intersecting said major surface;

at least one first region of a second conductivity type opposite to said first conductivity type formed in the major surface of said substrate;

a second region of said second conductivity type formed in said substrate at a portion thereof including said major surface and said edge and forming a PN junction with said substrate exposed at the side portion of said substrate;

a first electrode contacting said second region; and means for causing the flow of a large leakage current in said PN junction and effectively stabilizing the potential of said substrate, effectively grounding said first electrode with said substrate, comprising a mechanically distorted portion of said second region at the edge portion thereof with the edge of said substrate.

15. A semiconductor device according to claim 14, wherein said first conductivity type is N type and said second conductivity type is P type and further including a second electrode contacting said first region.

16. A semiconductor device according to claim 14, wherein said distorted portion extends substantially over the entire edge area of said substrate.

* * * * *